US 9,019,001 B2

(12) United States Patent
Kelley et al.

(10) Patent No.: US 9,019,001 B2
(45) Date of Patent: Apr. 28, 2015

(54) GATE DRIVER FOR ENHANCEMENT-MODE AND DEPLETION-MODE WIDE BANDGAP SEMICONDUCTOR JFETS

(75) Inventors: Robin Lynn Kelley, Starkville, MS (US); Fenton Rees, Mukilteo, WA (US)

(73) Assignee: Power Integrations, Inc., San Jose, CA (US)

( * ) Notice: Subject to any disclaimer, the term of this patent is extended or adjusted under 35 U.S.C. 154(b) by 2 days.

(21) Appl. No.: 13/468,287

(22) Filed: May 10, 2012

(65) Prior Publication Data

US 2012/0218011 A1    Aug. 30, 2012

Related U.S. Application Data

(63) Continuation of application No. 12/777,961, filed on May 11, 2010, now Pat. No. 8,203,377.

(60) Provisional application No. 61/177,014, filed on May 11, 2009.

(51) Int. Cl.
*H03K 17/687* (2006.01)
*H03K 17/0412* (2006.01)

(52) U.S. Cl.
CPC .. *H03K 17/04123* (2013.01); *H03K 2017/6875* (2013.01)

(58) Field of Classification Search
USPC ......... 327/108–112, 170, 374–377, 379, 284, 327/427, 434; 326/21–24, 82–84, 89
See application file for complete search history.

(56) References Cited

U.S. PATENT DOCUMENTS

| 4,906,867 | A  | 3/1990  | Petty           |
|-----------|----|---------|-----------------|
| 5,128,567 | A  | 7/1992  | Tanaka et al.   |
| 5,231,311 | A  | 7/1993  | Ferry et al.    |
| 5,285,116 | A  | 2/1994  | Thaik           |
| 5,742,183 | A  | 4/1998  | Kuroda          |
| 5,859,552 | A  | 1/1999  | Do et al.       |
| 5,898,321 | A  | 4/1999  | Ilkbahar et al. |
| 5,977,814 | A  | 11/1999 | Ishii           |
| 6,163,178 | A  | 12/2000 | Stark et al.    |
| 6,204,700 | B1 | 3/2001  | Seyed           |
| 6,320,449 | B1 | 11/2001 | Capici et al.   |

(Continued)

FOREIGN PATENT DOCUMENTS

| CN | 1199275 A   | 11/1998 |
|----|-------------|---------|
| DE | 19855604 C1 | 6/2000  |

(Continued)

OTHER PUBLICATIONS

D. Bortis, P. Steiner, J. Biela, and J. W. Kolar, "Double-Stage Gate Driver Circuit for Parallel Connected IGBT Modules," Proc. of the 2008 IEEE International Power Modulator Conference (2008).

(Continued)

*Primary Examiner* — Quan Tra

(57) ABSTRACT

A DC-coupled two-stage gate driver circuit for driving a junction field effect transistor (JFET) is provided. The JFET can be a wide bandgap junction field effect transistor (JFET) such as a SiC JFET. The driver includes a first turn-on circuit, a second turn-on circuit and a pull-down circuit. The driver is configured to accept an input pulse-width modulation (PWM) control signal and generate an output driver signal for driving the gate of the JFET.

21 Claims, 13 Drawing Sheets

(56) References Cited

U.S. PATENT DOCUMENTS

| | | |
|---|---|---|
| 6,333,665 B1 | 12/2001 | Ichikawa |
| 6,441,673 B1 | 8/2002 | Zhang |
| 6,531,895 B1 | 3/2003 | Barrett et al. |
| 6,556,407 B2 | 4/2003 | Brando et al. |
| 6,707,325 B2 | 3/2004 | Taguchi et al. |
| 6,724,227 B2 | 4/2004 | Imai |
| 6,756,826 B1 | 6/2004 | Klein et al. |
| 6,809,560 B1 | 10/2004 | Wrathall |
| 6,812,618 B2 | 11/2004 | Hayashi |
| 6,819,227 B2 | 11/2004 | Arndt |
| 6,836,173 B1 | 12/2004 | Yang |
| 7,034,600 B2 | 4/2006 | Scheikl |
| 7,061,301 B2 | 6/2006 | Pham |
| 7,071,740 B2 | 7/2006 | Adams et al. |
| 7,151,401 B2 | 12/2006 | Inoue |
| 7,233,191 B2 | 6/2007 | Wang et al. |
| 7,719,055 B1 * | 5/2010 | McNutt et al. ............... 257/341 |
| 8,207,760 B2 | 6/2012 | Pham |
| 2001/0017554 A1 | 8/2001 | Tsuji |
| 2001/0040470 A1 | 11/2001 | Brando et al. |
| 2002/0105414 A1 | 8/2002 | Arndt |
| 2004/0021498 A1 | 2/2004 | Scheikl |
| 2004/0036511 A1 | 2/2004 | Otoshi et al. |
| 2004/0164785 A1 | 8/2004 | Metzler |
| 2005/0258458 A1 | 11/2005 | Wang et al. |
| 2006/0290388 A1 * | 12/2006 | Tolle et al. ............... 327/108 |
| 2008/0174184 A1 | 7/2008 | Arpilliere et al. |
| 2008/0290927 A1 | 11/2008 | Mazzola et al. |
| 2009/0066402 A1 * | 3/2009 | Hiyama ............... 327/392 |
| 2009/0237062 A1 * | 9/2009 | Tai et al. ............... 323/311 |

FOREIGN PATENT DOCUMENTS

| | | |
|---|---|---|
| DE | 10217611 A1 | 11/2003 |
| EP | 0690572 A2 | 1/1996 |
| EP | 1221771 A1 | 7/2002 |
| JP | 1279631 A | 11/1989 |
| JP | 9046201 A | 7/1995 |
| JP | 10013206 A | 1/1998 |
| JP | 2000232347 A | 8/2000 |

OTHER PUBLICATIONS

G. Schmitt, R. Kennel, and J. Holtz, "Voltage Gradient Limitation of IGBTs by Optimized Gate-Current Profiles," Power Electronics Specialists Conference, 2008. PESC 2008, pp. 3592-3596 (Jun. 15-19, 2008).

M. Abu-Khaizaran, R Palmer, and Y. Wang, "Parameters Influencing the Performance of an IGBT Gate Driver," Power Electronics Specialists Conference, 2008, pp. 3457-3462 (Jun. 15-19, 2008).

International Search Report, Dated Dec. 1, 2010.

* cited by examiner

GATE DRIVER FOR ENHANCEMENT-MODE AND DEPLETION-MODE WIDE BANDGAP SEMICONDUCTOR JFETS

This application is a continuation of U.S. patent application Ser. No. 12/777,961, filed on May 11, 2010, pending, which is a non-provisional of U.S. Patent Application No. 61/177,014, filed on May 11, 2009. Each of the above applications is incorporated by reference herein in its entirety.

TECHNICAL FIELD

The present invention relates generally to gate drivers and integrated circuits including the same, and more particularly, to an n-channel junction field effect transistor (JFET) based gate driver for enhancement-mode and depletion-mode wide bandgap semiconductor JFETs.

BACKGROUND OF THE TECHNOLOGY

One application for wide bandgap junction field effect transistors (JFETs) is in high voltage, high frequency power electronics. The exceptional device properties of wide bandgap JFETs make these devices capable of replacing high voltage insulated gate bipolar transistors (IGBTs) in a number of applications. Switching energy losses are one of the main characteristics of power semiconductor switches that are compared when selecting a device for new design. The transition speed is ultimately limited by the device. However, the performance of the gate driver can impact this speed considerably.

The main function of the gate driver is to deliver/remove the necessary gate charge required the by internal gate-source and Miller capacitance of the device in order for the device to transition between states. The faster the gate driver can perform this task, the faster the device will transition from off-state to the on-state, and from the on-state to the off-state. Therefore it is important to use a properly designed gate driver circuit for maximum performance of the device within a practical system application.

The gate structure of the JFET poses two distinct requirements in order to drive the device into conduction. These requirements are similar to a combination of a metal oxide semiconductor field effect transistor (MOSFET) and a bipolar junction transistor (BJT). First a high peak transient current is recommended for quickly charging the gate capacitance, like that of a MOSFET. Second a small DC gate current is required to maintain conduction, similar to a BJT.

An AC coupled, BJT-like RC driver can be used for wide bandgap JFETs in most applications. A driver of this type is depicted in FIG. 1. This driver solution has proven to provide exceptional switching performance, but experiences duty factor and switching frequency limitations. The RC driver is composed of a paralleled resistor and bypass capacitor connected between the gate/base of a semiconductor switch and the output of a Pulse Width Modulated (PWM) IC or other pulse generating circuit.

The RC driver is capable of level shifting, setting a DC current limit, as well as providing the high peak transient current required by most power semiconductors for a fast turn-on. To consistently maintain maximum switching speeds, the bypass capacitor of the RC driver must be full discharged prior to the next switching event. The time to discharge is depended on the RC time constant of the RC driver. Therefore the maximum switching frequency and duty factor of the application is limited by the RC time constant of the RC driver.

Accordingly, there still exists a need for improved gate drivers for wide bandgap JFETs and, in particular, an active, DC coupled driver that can overcome the limitations of the RC driver.

SUMMARY

A two-stage gate driver circuit for driving a junction field effect transistor (JFET) having a gate, a source and a drain is provided which comprises:
an input for supplying a control pulse signal $V_{in}$;
three resistors, $R_1$, $R_2$ and $R_3$, each having first and second terminals and being electrically coupled to the gate of the JFET by the second terminal;
a first turn-on circuit electrically coupled between the input and the first terminal of the resistor $R_2$;
a second turn-on circuit electrically coupled between the input and the first terminal of the resistor $R_1$; and
a pull-down circuit electrically coupled between the input and the first terminal of the resistor $R_3$.

A two-stage gate driver circuit for driving a junction field effect transistor (JFET) having a gate, a source and a drain is also provided which comprises:
an input for supplying a control pulse signal $V_{in}$;
a first turn-on circuit;
a second turn-on circuit; and
a pull-down circuit,
wherein the first turn-on circuit, the second turn-on circuit and the pull-down circuit are electrically coupled between the input and the gate of the JFET in parallel.

These and other features of the present teachings are set forth herein.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment.

DETAILED DESCRIPTION

Figure 1:
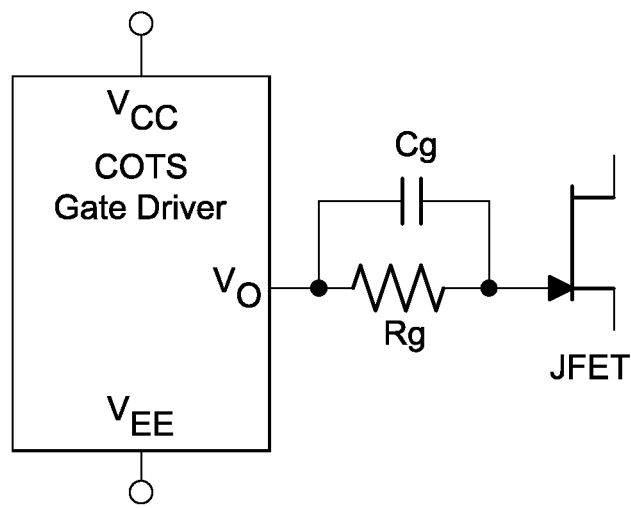
FIG. 1 is a circuit diagram of an AC coupled RC gate driver.

Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The description will be made as to the embodiments of the present invention in conjunction with the accompanying drawings.

The transition speed of a JFET is ultimately limited by the device. However, the performance of the gate driver can impact this speed significantly. As set forth above, two main requirements must be satisfied by the gate driver: delivery/removal of dynamic gate charge; and sustainability of DC gate voltage and resulting gate-source current during conduction. The ability of the gate driver to quickly deliver/remove the necessary gate charge required by the internal gate-source and Miler capacitance of the device is the main factor that affects the time it takes for the device to transition between states. The gate drive should also be designed to efficiently maintain the steady state DC gate voltage and gate current required to maintain minimum $R_{DS(ON)}$ during conduction.

The AC (capacitor) coupled gate driver circuit interfaces the gate of the JFET to the output of a standard COTS MOSFET/IGBT gate driver ICs with a simple RC network to allow for a drop-in replacement of MOSFETs or IGBTs with a normally-off SiC JFET in a range of applications. While the AC coupled driver has proven to be an effective means of driving an enhancement-mode (EM) SiC JFET, it can experience duty factor and switching frequency limitations.

FIG. 1 provides a schematic diagram of the AC-coupled drive. This particular gate driver uses a current limiting resistor $R_{CL}$ to set the DC operating point in the "on" state by dropping the potential difference between the high level output of the gate driver IC and the required gate-source voltage of the SiC JFET at a specified $I_{GFWD}$. The bypass capacitor is used to rapidly deliver/remove the dynamic gate charge for a fast turn-on and turn-off. In a sense, the capacitor appears to overdrive the gate of the JFET, visible by the overshoot of the gate-source voltage as measured at the terminals. Overdriving the gate for a duration of <200 ns with a maximum driver IC voltage of +15V connected to the gate through a low ohm resistor is acceptable and recommended for fast turn on. As the device is transitioning between a blocking state and conduction state, high peak currents from the gate drive are delivering the charge required by the input capacitance and not flowing through the gate-source diode. Once the input capacitance is fully charged steady state conditions will be regulated by the current limiting resistor. An additional low ohm resistor (typically 1-5 ohms) can be included in series with the bypass capacitor to dampen any observed gate ringing.

This type of driver can be used with unipolar or bipolar drive voltages. If used with a unipolar drive voltage, the bypass capacitor will provide some negative gate bias at turn-off to aid in reduced turn-off times and provide a degree of noise immunity for a limited duration of time. As MOSFETs and IGBTs are typically interfaced to a driver IC through a gate resistor, a simple change in resistor value and the addition of a bypass capacitor is all that is necessary to convert a standard MOSFET/IGBT drive to a SiC JFET drive in most power switching topologies.

The appropriate $C_{BP}$ value is selected based on $Q_g$ of the SiC JFET and its independent PWM/driver IC supply rail voltages. Parasitic circuit effects can influence the selection of $C_{BP}$, so one particular value is $C_{BP}$ is not necessarily appropriate for all applications. Rather a range of $C_{BP}$ values to be evaluated empirically is suggested to the user as a starting point and defined by the following expression:

$$\frac{2*Q_g}{V_{DD} - V_{GS}} \leq C_{BP} \leq \frac{4*Q_g}{V_{DD} - V_{GS}}$$

RCL is used to limit the continuous current flowing from the PWM/driver IC through the gate-source diode of the SiC JFET, thus setting the gate-source voltage. To avoid overdriving the gate of the JFET during steady state conduction, it is recommended that a positive gate-source bias of no more than +3.0V be applied. The selection of $R_{CL}$ requires the following information:

a. $V_O$=Positive output voltage of the PWM/driver IC b. $V_{GS}$=Desired JFET gate-source voltage c. $I_{GFWD}$=Gate-source diode current at the desired gate-source voltage. $I_{GFWD}$ can be estimated from Figure X of the datasheet.

The following expression is then used to calculate $R_{CL}$:

$$R_{CL} = \frac{V_o - V_{gs}}{I_{GFWD(@Vgs)}}.$$

To consistently obtain the fastest switching performance possible, it is necessary for the bypass capacitor of the RC network to be fully discharged prior to the next switching event. The size of this capacitor depends on the specifics of the application and the driver IC. Any particular value may need more time to discharge than that available for certain combinations of switching frequency and duty factor. While no operational problems will result from not fully discharging this capacitor; slower turn-on transitions will result as there is less voltage differential between the output of the driver IC and the capacitor voltage at the next turn-on event. Therefore additional DC-coupled gate driver designs that can operate over a wider range of switching frequencies and duty factors are necessary.

Figure 2:
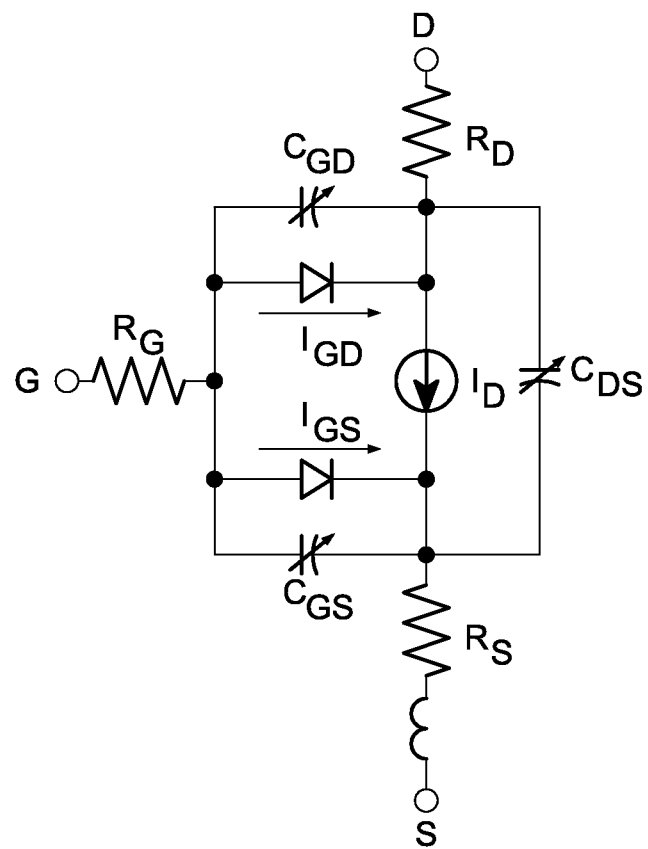
FIG. 2 is a schematic representation of a VJFET modeled as a capacitance in parallel with a pn diode.

This gate-source and gate drain structure of the JFET device can be modeled as a capacitance in parallel with a pn diode as shown in FIG. 2. This device equivalent model is unique, and represents some characteristics of a MOSFET, and some characteristics of a BJT. The power JFET presents two main requirements for the gate driver: fast delivery/removal of dynamic charge for charging/discharging the total gate capacitance; and sustainability of the required steady state voltage/current requirements of the gate-source diode through the duration of the conduction state.

Figure 3:
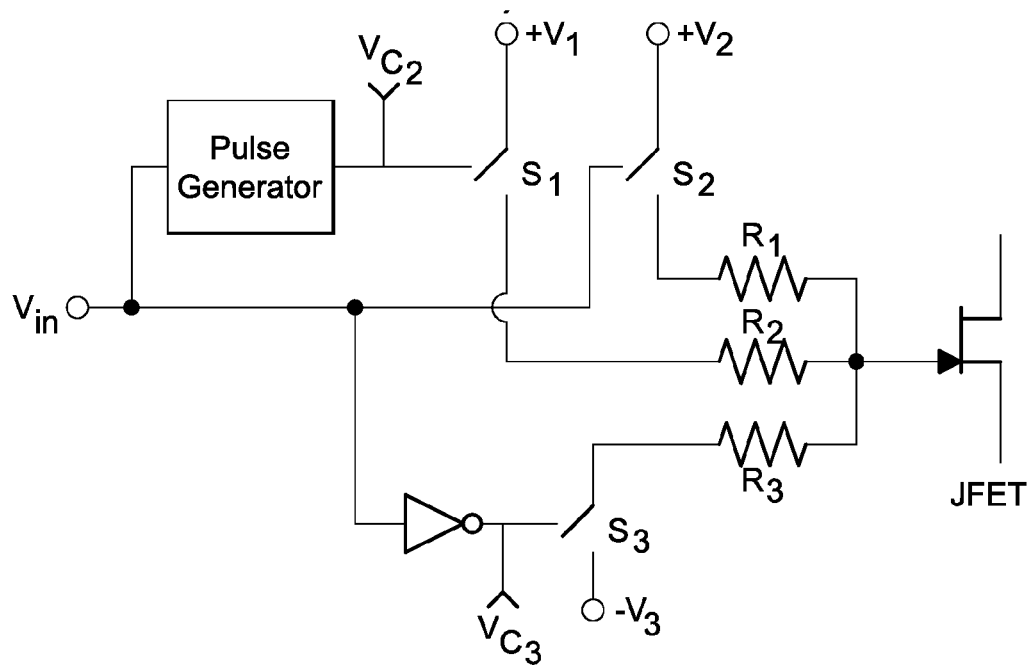
FIG. 3 is a circuit diagram of a DC-coupled two stage gate driver for wide-bandgap JFETs.
Figure 4:
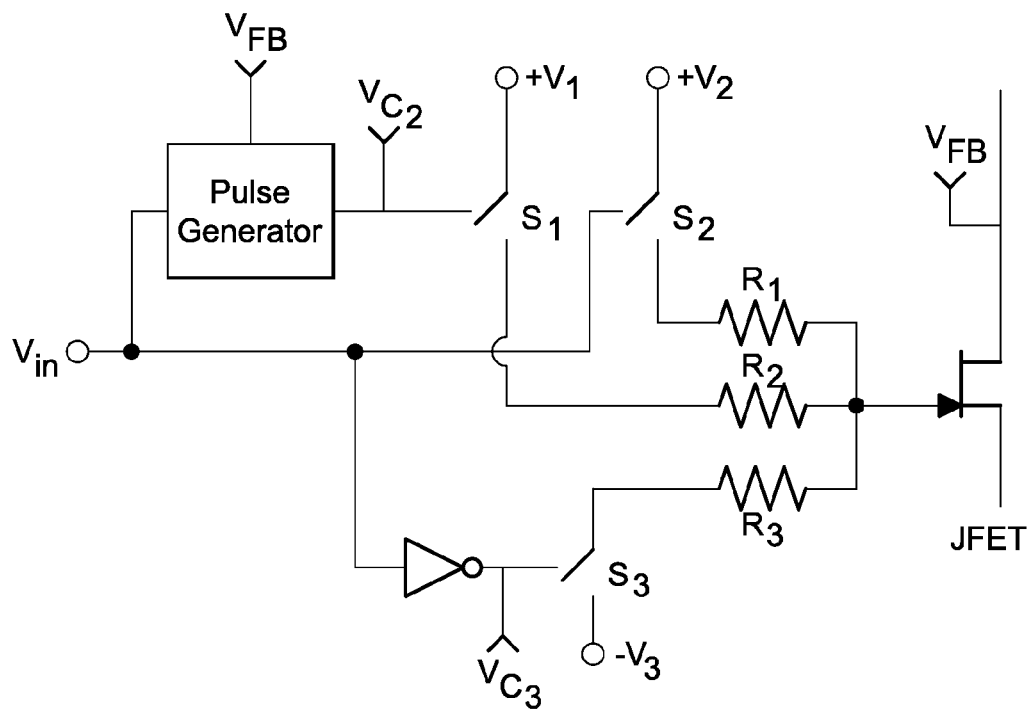
FIG. 4 is a circuit diagram of a DC-coupled two stage gate driver for wide-bandgap JFETs with feedback to a pulse generator circuit.
Figure 5:
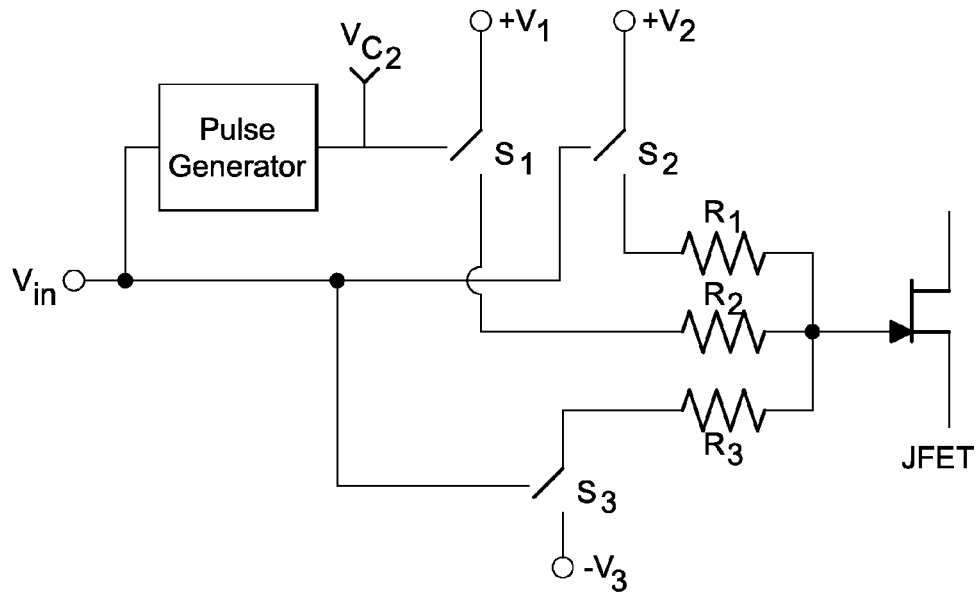
FIG. 5 is a circuit diagram of a DC-coupled two stage gate driver for wide-bandgap JFETs according to a further embodiment.
Figure 6:
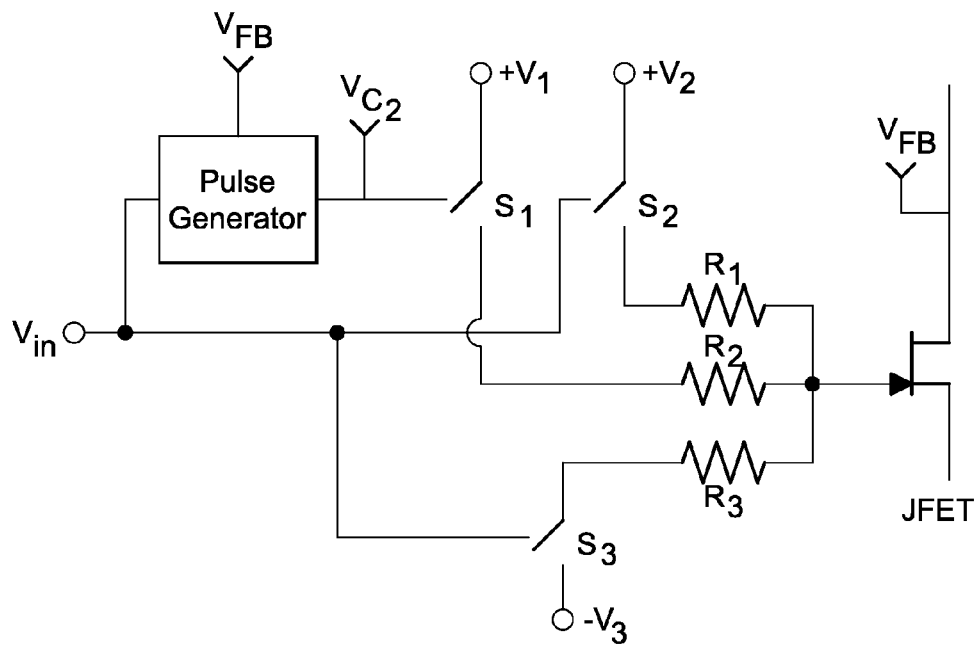
FIG. 6 is a circuit diagram of a DC-coupled two stage gate driver for wide-bandgap JFETs with feedback to a pulse generator circuit according to a further embodiment.

High frequency applications need a driver that is not dependent on an RC time constant for best performance. A two-stage, DC-coupled driver design has been developed specifically for the JFET. A two-stage, DC-coupled driver according to one embodiment is shown in FIG. 3. Other embodiments of the two-stage gate driver are depicted in FIGS. 4, 5 and 6. The driver can apply a high peak current pulse for supplying the required dynamic charge as quickly as possible for a fast turn-on and also maintain the steady state DC gate voltage/current to sustain conduction. The driver can be used to overdrive the gate during the turn-on transient. The two-stage driver developed allows for precise control of the overdrive conditions as well as the steady state condition.

The circuit shown in FIG. 3 accepts a single PWM control signal and generates a second pulse-width modulation (PWM) signal that is synchronized with the original control signal. The generated pulse drives the first turn-on stage which provides a high peak current source for quickly charging the device's gate and Miller (or gate to drain) capacitance. The pulse width of this second control pulse lasts until the Miller capacitance of the device is fully charged and the drain-source voltage is fully collapsed. This second control pulse can be generated by an open or closed loop circuit.

The second PWM signal that is synchronized with the original control signal has a much shorter pulse width. The generated pulse drives a first turn-on stage which controls delivery of dynamic gate charge. Switch $S_1$ of the first stage connects a high peak current source for quickly charging the device's gate and miller capacitance at turn-on. The original control pulse is applied to the second turn-on stage, where switch $S_2$ supplies the necessary steady state DC gate current required to maintain conduction. Current limiting resistor $R_1$ is properly sized to set the forward gate current $I_{GFWD}$ while stepping down the voltage from the positive rail voltage to that required by the gate of the JFET. $R_1$ is sized with the same approach used for the current limiting resistor in the AC-coupled RC drive circuit. The complement of the user supplied PWM pulse controls the turn-off stage which pulls the JFET gate low through a low ohm pull-down resistor $R_3$. This driver approach can be realized in many ways; using discrete transistors, multiple driver ICs, or a single dual driver IC. The method chosen will depend upon the required driver voltages, transition times, and desired peak current supply.

The original control pulse is applied to the second turn-on stage which supplies the necessary steady state DC gate current required to maintain conduction. A current limiting resistor is properly sized to set the forward gate current while stepping down the voltage from the positive rail voltage to that required by the gate of the JFET. When the user input PWM signal transitions to the logic state indicating the desired $t_{off}$ duration of the JFET, a pull-down circuit pulls the gate to either the switch common or a negative voltage through a small pull-down resistor.

Depending upon the transistor technology used (i.e., FET or bipolar) the inverting circuit may not be necessary to drive the pull-down circuit. FIG. 4 shows a DC-coupled two stage gate driver for wide bandgap JFETs with feedback to a pulse generator circuit. FIG. 5 is a circuit diagram of a DC-coupled two stage gate driver for wide-bandgap JFETs according to a further embodiment. FIG. 6 is a circuit diagram of a DC-coupled two stage gate driver for wide-bandgap JFETs with feedback to a pulse generator circuit according to a further embodiment. As shown in FIGS. 4-6, the two-stage gate driver is divided into three sections.

Figure 10:
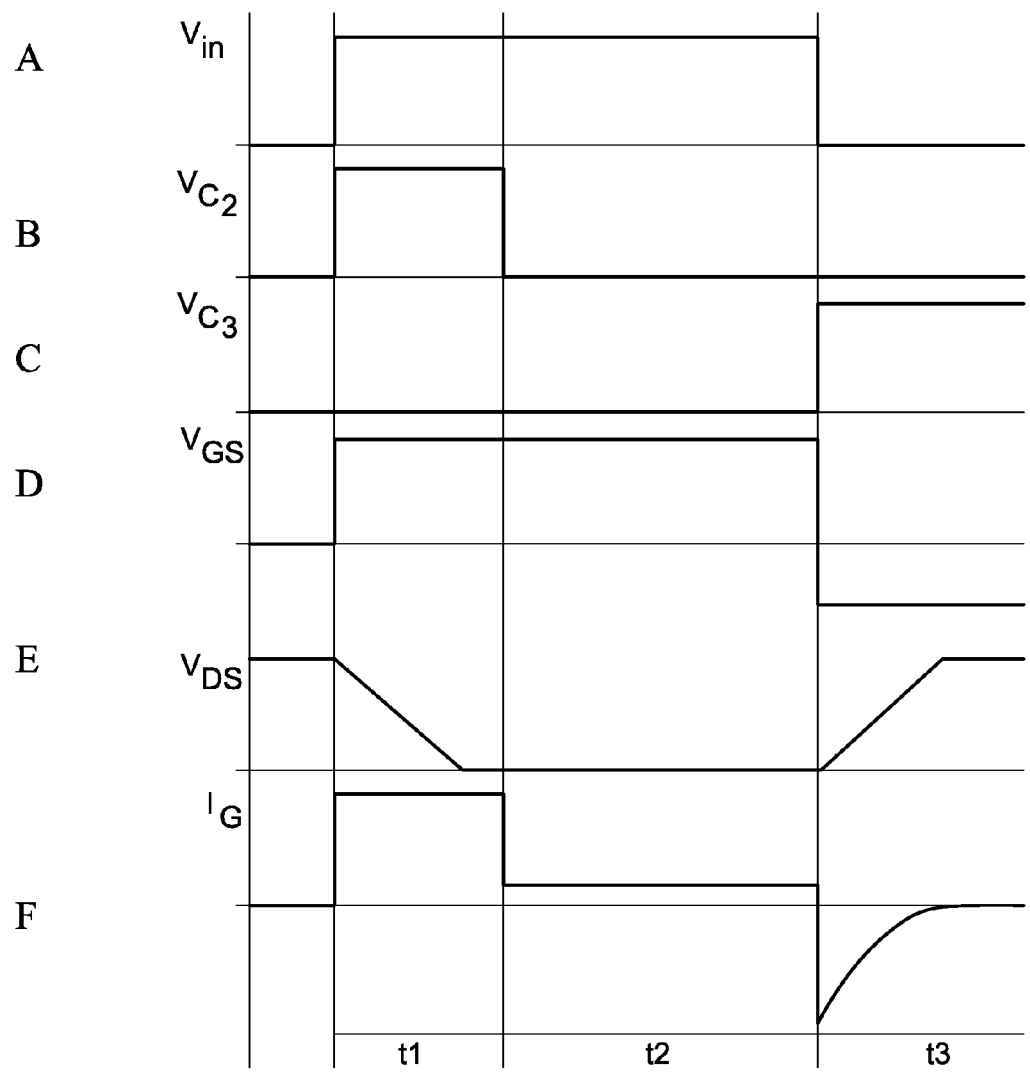
FIG. 10A-10F show operating waveforms for a two-stage JFET gate driver.

FIGS. 10A-10F provide corresponding waveforms describing the complete gate driver operation. During the period $t_1$ the first turn-on circuit is active. A user input, $V_{in}$, shown in FIG. 10A, is accepted and the pulse generator circuit derives a second control pulse, $Vc_2$, which is shown in FIG. 10B. $Vc_2$ drives a switch that connects the gate of the JFET to a high peak current source through a small damping resistor $R_2$. The waveform for the gate current ($I_G$), which is shown in FIG. 1F, illustrates that for the duration of $t_1$ the gate current is high, ≤1 A. After the drain-source voltage, $V_{DS}$, which is shown in FIG. 10E, collapses the first turn-on circuit is turned off.

The duration of time $t_1$ can be manually adjusted in the case of the preferred embodiment or automatically adjusted based on feedback from the JFET. The second turn-on circuit is also turned on at the start of $t_1$. However, the small current contribution of this stage of the driver is minimal compared to that of the first turn-on stage. After the first turn-on circuit is deactivated the second turn-on circuit regulates the DC gate current, (≤1 A) for the remainder of the conduction period. From FIG. 10F, it can be seen that $I_G$ is reduced to a much lower value at the start of $t_2$. The end of the $t_2$ period is determined by the user input voltage. The gate pull-down circuit is activated at the end of $t_2$ starting period $t_3$. During this period the JFET is to transition to a blocking state and remain blocking until the next input pulse is received. During $t_3$ the pull-down circuit holds the gate of the device at either switch common or a negative voltage for the duration of the blocking state.

Figure 7:
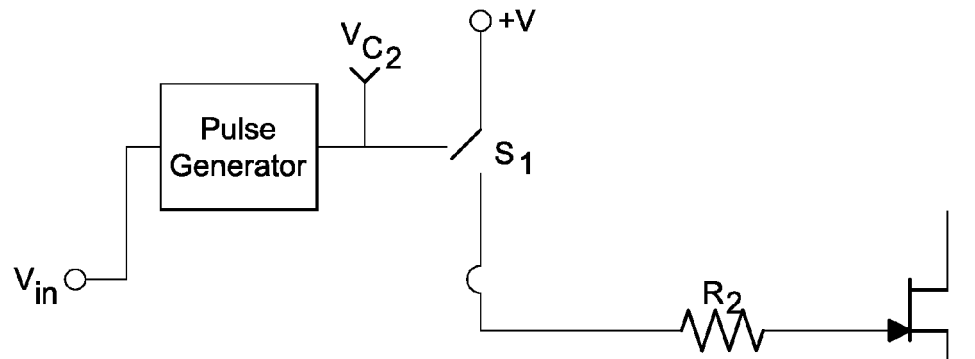
FIG. 7 is a circuit diagram showing a portion of the gate driver in operation during period $t_1$.
Figure 8:
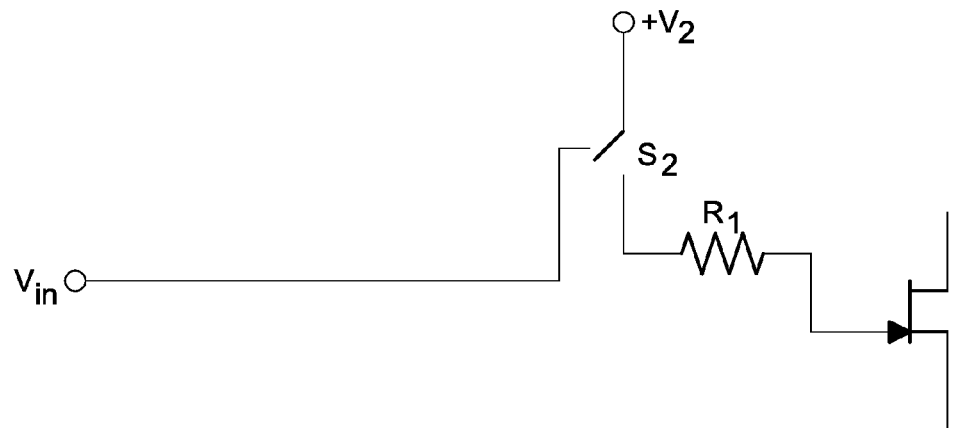
FIG. 8 is a circuit diagram showing a portion of the gate driver in operation during period $t_2$.
Figure 9:
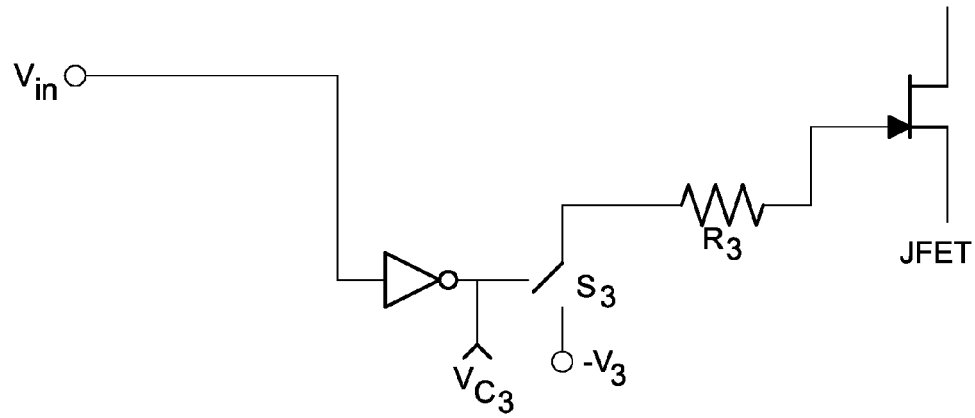
FIG. 9 is a circuit diagram showing a portion of the gate driver in operation during period $t_3$.

FIG. 7 is a circuit diagram showing a portion of the gate driver in operation during period $t_1$. FIG. 8 is a circuit diagram showing a portion of the gate driver in operation during period $t_2$. FIG. 9 is a circuit diagram showing a portion of the gate driver in operation during period $t_3$.

Exemplary Embodiments

A circuit is provided which comprises:
a wide bandgap junction field effect transistor (JFET); and
a DC-coupled, two-stage driver, wherein the driver comprises:
a first turn-on circuit;
a second turn-on circuit; and
a pull-down circuit;
wherein the driver is configured to accept an input pulse-width modulation (PWM) control signal and generate an output driver signal for driving the gate of the wide bandgap JFET.

The period of the user input control pulse can be equal to the sum of the pulse duration, $t_{on}$ that indicates the time in which the JFET is to be in conduction and the pulse duration, $t_{off}$ that indicates the time in which the JFET is to be blocking.

The first turn-on circuit can comprise a pulse generator circuit and a high peak current source. The pulse generator circuit can accept the user input PWM control signal and generate a second control pulse. The output can be in sync with the user input pulse but with ≤15% of the pulse width of the user input pulse. The first turn-on circuit can be connected to a positive rail voltage $+V_1$. The pulse width can be adjustable. For example, the pulse width can be manually adjusted or automatically adjusted based on feedback from the JFET.

The first turn-on circuit can connect the gate of the widebandgap JFET to a high peak current source through a low value (e.g., <10 Ohms) damping resistor.

The first turn-on circuit can be active for ≤15% of the $t_{on}$ duration of the user input control pulse as determined by the pulse generator circuit.

The second turn-on circuit can connect the gate of the transistor to a positive voltage rail, $+V_2$, by a current limiting resistor (e.g., <2 kOhms). The second turn-on circuit can be active for the full $t_{on}$ duration of the user input control pulse.

The pull-down circuit can connect the gate of the transistor to a circuit common or negative voltage, $-V_3$, rail through a low damping resistor (e.g., <100 Ohms). The pull-down circuit can include an inverting circuit. The pull-down circuit can be active for the $t_{off}$ duration of the user input voltage.

The positive rail voltages $+V_1$ and $+V_2$ can be separate positive voltages or connected to the same positive voltage rail.

EXPERIMENTAL

Figure 11A:
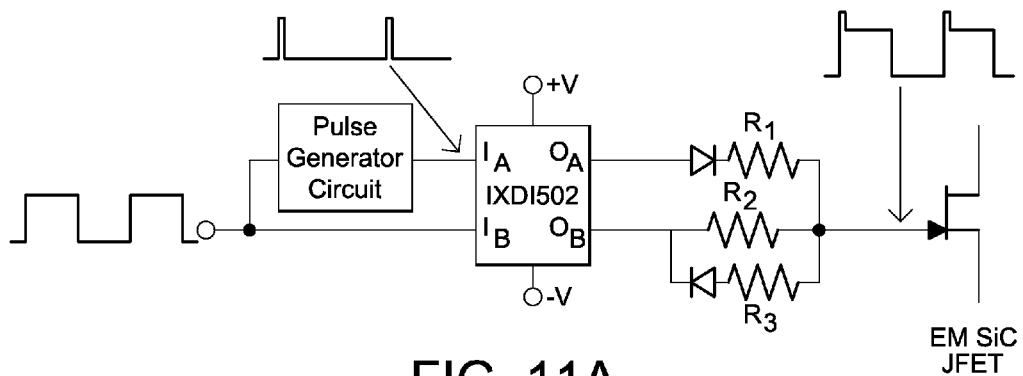
FIG. 11A is a circuit diagram of a dual driver IC being used to drive an enhancement-mode (EM) SiC JFET.

A dual driver IC was used to drive an enhancement-mode (EM) SiC JFET. This approach is depicted in FIG. 11A. In this circuit, driver A controls the dynamic charging conditions while driver B controls the steady state gate conditions. The pulse width of the input to drive A can be limited to ≤200 ns. Since the purpose of driver A is to deliver a high peak current for charged the devices input capacitance, its pulse width should not exceed the turn-on time of the device by more than 100 ns. Again, high peak current supplied during the turn-on transient is internally distributed so that it delivers charge to the input capacitance and is not simply flowing through the gate-source diode. This results in an overshoot of the gate voltage greater than +3 V for a precisely limited time. However, once the input capacitance is fully charged and the drain voltage fully collapses the gate voltage will continue to rise, allowing high current to flow to the gate-source diode until driver A is turned off. It is recommended that the time difference between the end of the transition period and the time at which driver A is turned off be minimized as much as possible. For any duration of time that driver A remains active during the conduction period, excessive power loss will be dissipated by the gate and could result in damage to the gate if this duration lasts longer than 100 ns.

Figure 11B:
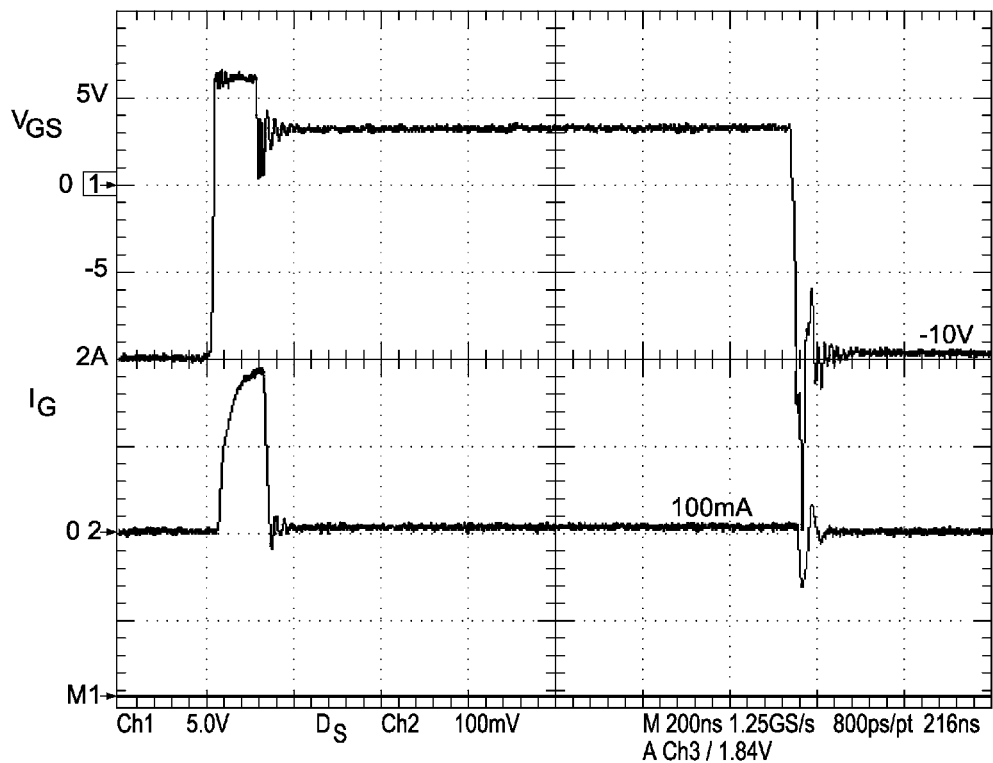
FIG. 11B are waveforms for the device of FIG. 11A.

FIG. 11B presents some experimental results for driving a SiC JFET using the dual drive circuit depicted in FIG. 11A. The SiC JFET used was SJEP120R125, manufactured by SemiSouth Laboratories, Inc. Gate drive voltages of +15 V and −10 V were supplied and resistors sized accordingly (i.e., $R_1=R_3=5$ ohms and $R_2=135$ ohms). Driver A pulse width was set to 100 ns.

FIG. 11B shows $I_{GS(PK)}=2$ A at $V_{GS}=+6V$ during the turn-on transition. Once driver A turns off and driver B takes control, the steady state conditions were measured at $V_{GS}=+3V$ and $I_{GS}=100$ mA.

Switching energy loss is one of the major performance factors used in comparing different semiconductor transistors for new designs. Minimizing this number is a priority for high switching frequency applications as this type of loss can become a significant portion of the total device losses. The normally-off SiC JFET is measured according to the same standard as MOSFET/IGBTs. A standard, double-pulse, clamped inductive load test circuit is used to observe the energy loss during both turn-on and turn-off. These measurements have also been conducted based on different drive voltage recommendations (i.e. unipolar or bipolar drive) as well as switch configurations (i.e. single device or bridge configuration). Measurements have also been conducted at elevated temperature and show that there is very little change in switching energy as junction temperature increases.

For single device applications, boost and buck converters for example, a unipolar drive voltage is typically sufficient for driving an EM SiC JFET. In these types of circuits current is commutated between the main power transistor and a freewheeling diode. While each application/design can present a different set of conditions, experimental results have thus far proven that the use of a negative rail is not usually needed in single switch applications. The use of the AC-coupled, RC driver has also proven to be sufficient for most single switch applications with the bypass capacitor providing some negative bias at turn-off (duration of negative bias based on RC time constant) to aid in a fast turn-off and provide some degree of noise immunity for a limited amount of time. The switching losses for a SiC JFET (i.e., SJEP120R125) have been observed under a variety of conditions. A +15V unipolar driver IC as well as a +15V/−10V bipolar driver in combination with the AC-coupled, RC driver interface was evaluated using the test circuit shown in FIG. 12A. The duty factor was adjusted to observe the difference in switching losses when the bypass capacitor was allowed to fully discharge and partially discharge. Table 1 lists the resulting turn-on losses for each case. As expected, the turn-on energy loss can be up to 2× greater when the bypass cap is not allowed to fully discharge prior to the next switching event. These results may or may not be sufficient based on the needs of a specific application and may require the use of the two-stage driver with a modest negative rail to achieve higher switching frequencies or higher duty factors.

Figure 12A:
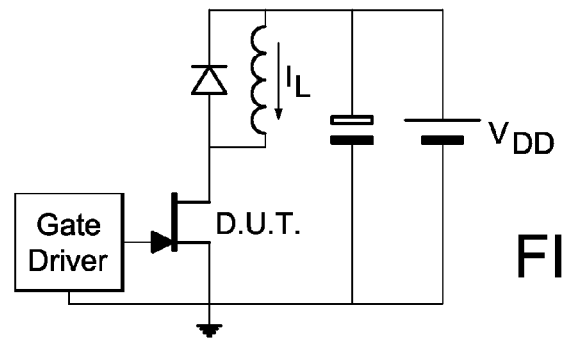
FIG. 12A is a circuit diagram of a switching energy test circuit for single device testing.
Figure 12B:
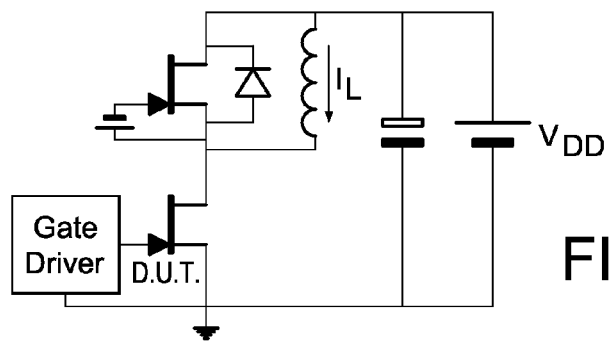
FIG. 12B is a circuit diagram of a switching energy test circuit for bridge configuration testing.
Figure 13:
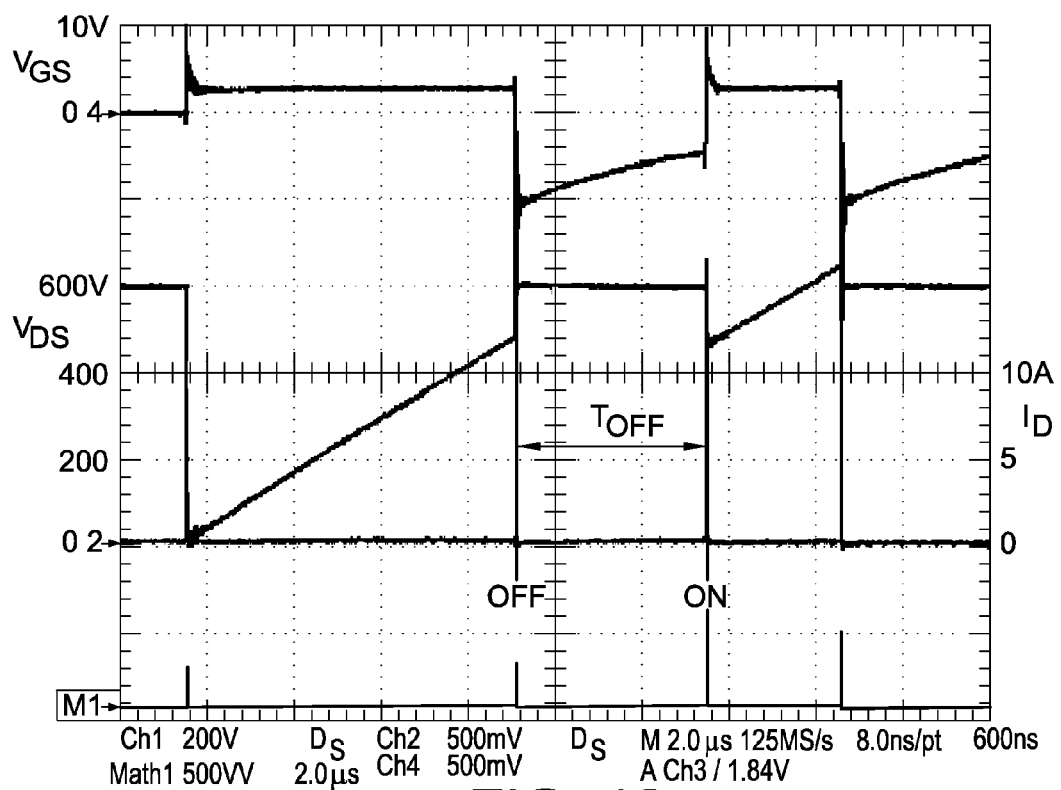
FIG. 13 shows operating waveforms for AC-coupled drive in a single switch test circuit of FIG. 12A.

The test circuit for monitoring the switching energy based on the conditions was modified to reflect the conditions experienced in applications using a bridge configuration as shown in FIG. 12B. For these applications, shoot through can be a real problem and thus noise immunity must be evaluated. A negative drive voltage is recommended for turn-off to aid in noise immunity and prevent shoot thru caused by the "Miller effect". Similar to MOSFETs and IGBTs there are three common approaches for preventing a positive spike on the gate voltage from reaching the device's threshold voltage:

a. negative drive voltage on gate during turn-off;
b. capacitive clamp connected closely at gate-source terminals;
c. limit the dV/dt during switching.

If the lowest possible switching losses are required, increasing the voltage differential between the turn-off voltage and the threshold voltage by adding or increasing the amount of negative voltage is recommended as a first approach. This is an easy solution and the only solution that does not impact the switching performance of either the high- or low-side device. However, as with all field-controlled power devices there is a limit to the amount of negative voltage that can be applied to the gate of the SiC JFET. If a positive gate spike is still evident after the maximum negative voltage is applied then another approach must be taken. A capacitive clamp connected tightly across the gate-source terminals of each device will provide a secondary source to pull necessary displacement current. This will reduce the positive spike at the gate; however, this method will require the gate driver to deliver more gate charge during each turn-on switching event. A modest increase in gate drive power and possibly a slightly slower turn-on speed will be observed. The last option is a downward adjustment of the dV/dt by adjusting a series gate resistance of the gate drive. This will reduce the peak current through the Miller capacitance of both switches and reduce the probability of shoot-through through the blocking switch. This third option will obviously result in slower switching than the maximum possible; therefore the designer must way the trade-offs for each specific application.

Figure 14A:
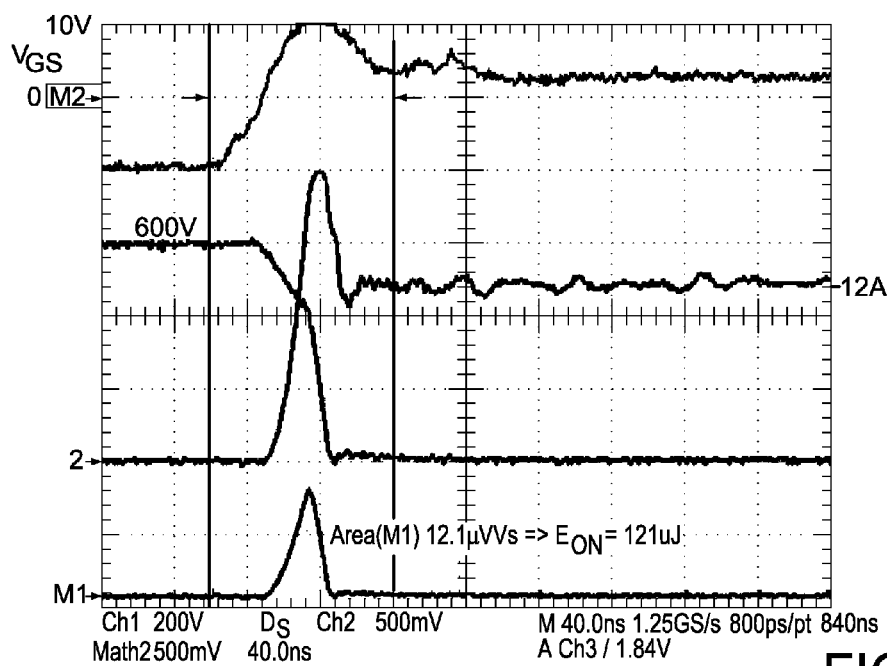
FIGS. 14A and 14B show switching energy measurements for a SiC JEFT (SJEP120R125) tested in a full phase leg using the test circuit of FIG. 12B.
Figure 14B:
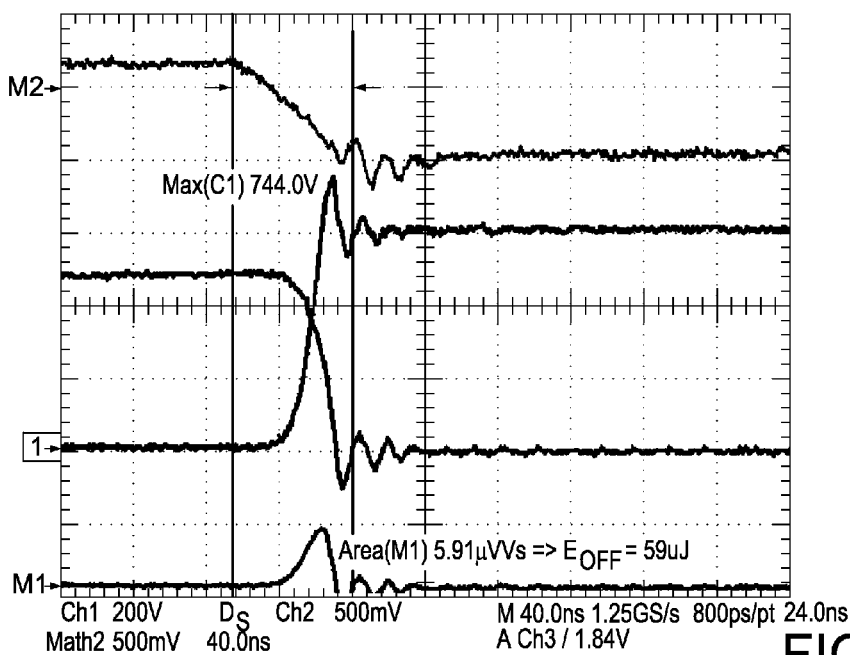

FIGS. 14A and 14B show switching energy measurements for a SiC JEFT (SJEP120R125) tested in a full phase leg using the test circuit of FIG. 12B.

Table 1 includes the switching losses observed using the test set up described by FIG. 12B using the DC-coupled gate driver.

still applicable for SiC JFET designs. Care must always be taken when creating PCB layouts for power converters such that additional coupling capacitances are not introduced, the device is not mounted to close to switching IC and magnetic components, symmetrical layouts are used when paralleling devices, and adequate cooling/heat sinking is obtained.

Gate ringing can be caused by feedback of high frequency noise through the Miller capacitance of the device or ground bounce cause by improper separate of signal and power grounds. Layouts should designed to properly separate power grounds from signal ground with a common connection between the two made at a single point. Also the proper use of ground planes can help shield the gate from the drain as well as other high frequency circuit connections. Ferrite beads connected as close as possible to the gate terminal of the SiC JFET may also be used to reduce voltage spikes at the gate. A small, low ohm external gate resistor may also be sufficient, as used in the design examples presented in this document. The use of a series R-C snubber connected directly across the main DC voltage bus has proven to reduce the amount of high frequency noise feedback through the miller capacitance. Lastly, gate drivers and gate turn-off components should always be connected as close as possible to the gate terminal of the device to reduce all of the aforementioned contributors of gate noise.

The specifics of the application can be evaluated to determine the best gate driver approach. The use of a dual driver IC is the simplest approach. However, two separate driver ICs can be used to achieve a desired peak current rating. Derivation of the overdrive pulse should be precise and closely match the turn-on speed of the transistor to minimize unnecessary gate power dissipation.

As with any low threshold device, noise immunity is an important concern. A negative turn-off voltage is recommended when using EM SiC JFETs in a bridge or series configuration. As with MOSFET/IGBTs the JFET can also

TABLE 1

Switching Energy Losses for SJEP120R125 (Conditions: $V_{DS}$ = 600 V, $I_D$ = 12A)

| Device Configuration | Test Circuit | Gate Driver | CBP Discharge | $E_{ON}$ (us) | $E_{OFF}$ (us) |
|---|---|---|---|---|---|
| Single Switch | FIG. 12A | Unipolar +15 V; AC-coupled drive | 100% | 75 | 38 |
| Single Switch | FIG. 12A | Unipolar +15 V; AC-coupled drive | 75% | 82 | 38 |
| Single Switch | FIG. 12A | Unipolar +15 V; AC-coupled drive | 58% | 105 | 38 |
| Single Switch | FIG. 12A | Unipolar +15 V; AC-coupled drive | 30% | 149 | 38 |
| Single Switch | FIG. 12A | Bipolar +15 V/−10 V; AC-coupled drive | 100% | 57 | 35 |
| Single Switch | FIG. 12A | Bipolar +15 V/−10 V; DC-coupled drive | N/A | 52 | 45 |
| Bridge | FIG. 12B | Bipolar +15 V/−10 V; 10 nF capacitive clamp; DC-coupled drive | N/A | 121 | 59 |

Figure 15A:
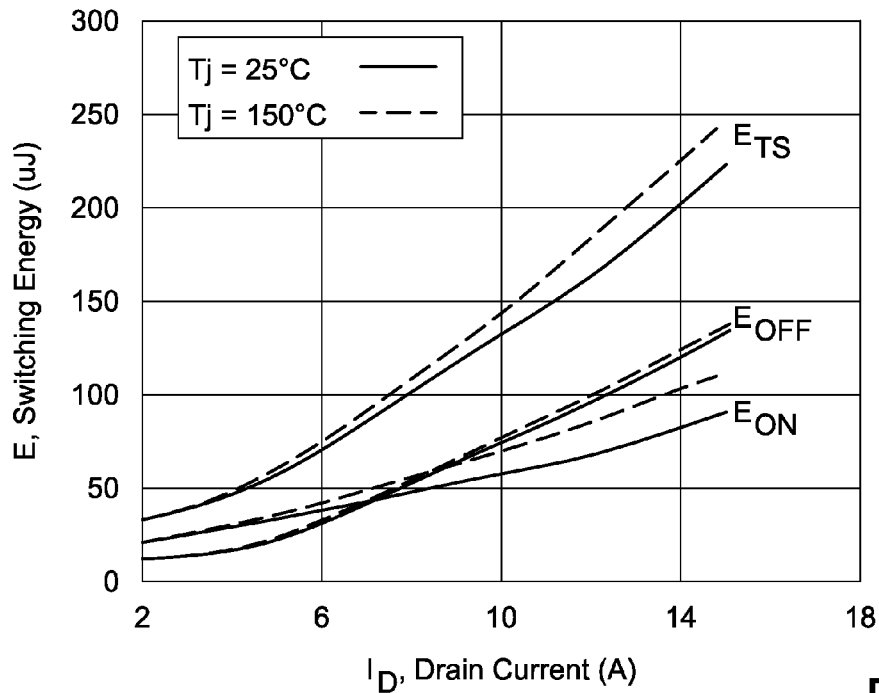
FIGS. 15A and 15B are graphs showing switching energy versus load current at junction temperatures of 25° C. and 150° C. for two SiC JFETs (SJEP120R125 and SJEP120R063).
Figure 15B:
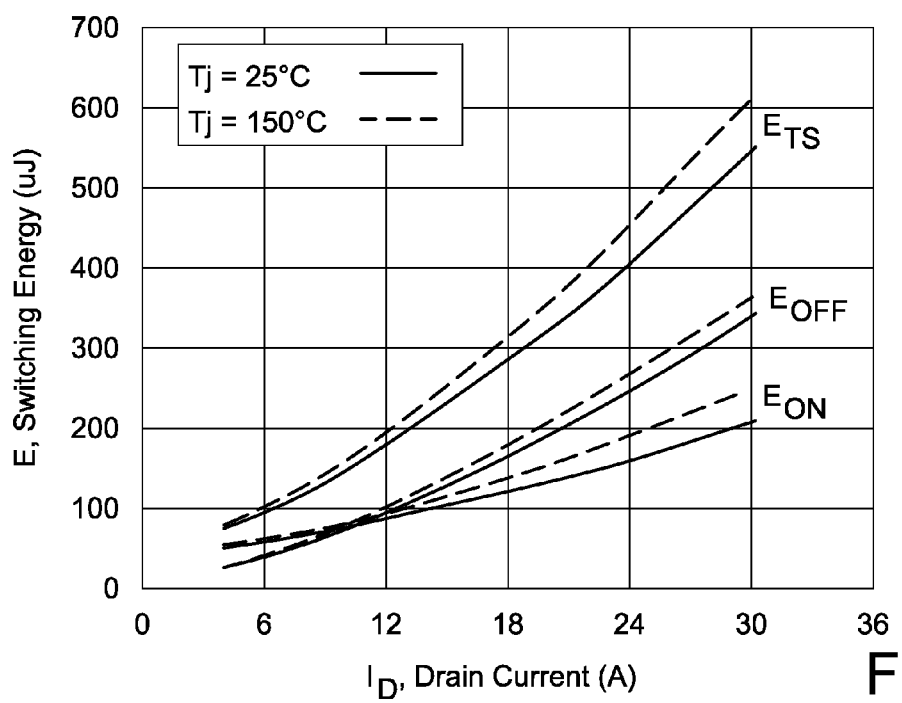

FIGS. 15A and 15B presents measured switching energy losses for two SiC JFETS (i.e., SJEP120R125 and SJEP120R063, both manufactured by SemiSouth Laboratories, Inc.) as a function of load current and junction temperature. As shown, there is approximately a 10% increase in total switching energy between 25° C. and 150° C. junction temperature.

Even though the enhancement-mode SiC JFET is a new device technology, many of the same design and layout tips valid for other types of high frequency power transistors are experiences false triggering due to the "miller effect". However, by increasing the voltage difference between the turn-off voltage and the gate threshold voltage this adverse effect can be minimized. If positive gate voltage spikes are still a problem then adding a small capacitive clamp across the gate-source terminals is recommended to limit the effect of high dV/dt on the gate of the opposing JFET.

Additional Embodiments

A circuit is also provided which comprises: a wide bandgap junction field effect transistor (JFET) and a DC-coupled, two-stage driver. The driver comprises: an upper turn-on driver (U9) circuit; a lower turn-on driver (U11) circuit; and a logic gate U12 for receiving a signal from its input and generating a brief "turn-on" pulse for the upper turn-on driver (U9). The upper and lower drivers are configured to accept an input pulse-width modulation (PWM) control signal and generate an output driver signal VG for driving the gate of the wide bandgap JFET.

According to this embodiment, the upper turn-on driver comprises a turn-on driver U9, a first resistor (5) and a first diode D1, with the output of the U9 coupled to the first terminal of the first resistor, the second terminal of the first resistor coupled to the anode terminal of the first diode D1, and the cathode of the first diode D1 formed the output of the upper driver circuit. The lower turn-on driver comprises a turn-on driver U11, a second resistor (100) having a first terminal and a second terminal, a second diode D2 having an anode and a cathode, and a third resistor having a first terminal and a second terminal. The output of the U11 is coupled to the first terminal of the second resistor and the cathode of the second diode D2. The anode of the second diode D2 is coupled to the first terminal of the third resistor. The second terminal of the third resistor is coupled to the second terminal of the third resistor to form the output of the lower driver circuit. The output of the upper driver circuit and the output of the lower driver circuit are connected together to form the input to the wide bandgap junction field effect transistor (JFET).

Figure 16A:
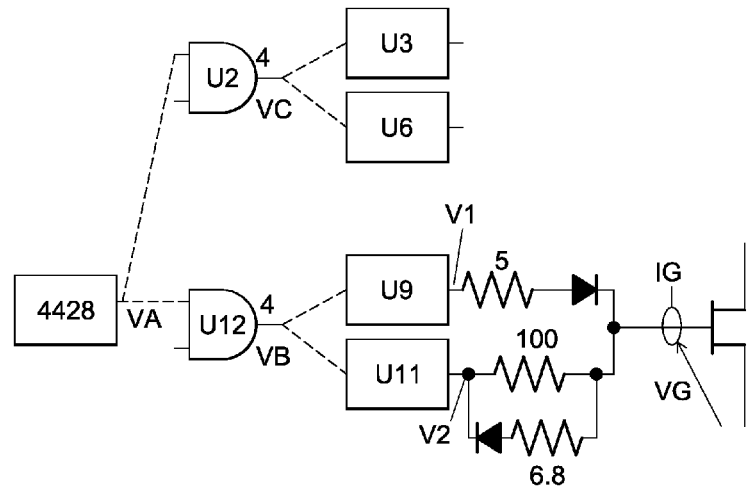
FIG. 16A depicts an approach to drive an enhancement-mode (EM) SiC JFET using dual driver circuits.

Dual driver circuits were used to drive an enhancement-mode (EM) SiC JFET. This approach is depicted in FIG. 16A. In this circuit, the output of the logic gate U12 is connected to the input of the upper turn-on driver U9 and the input of the lower turn-on driver U11.

Figures 16B, 16C:
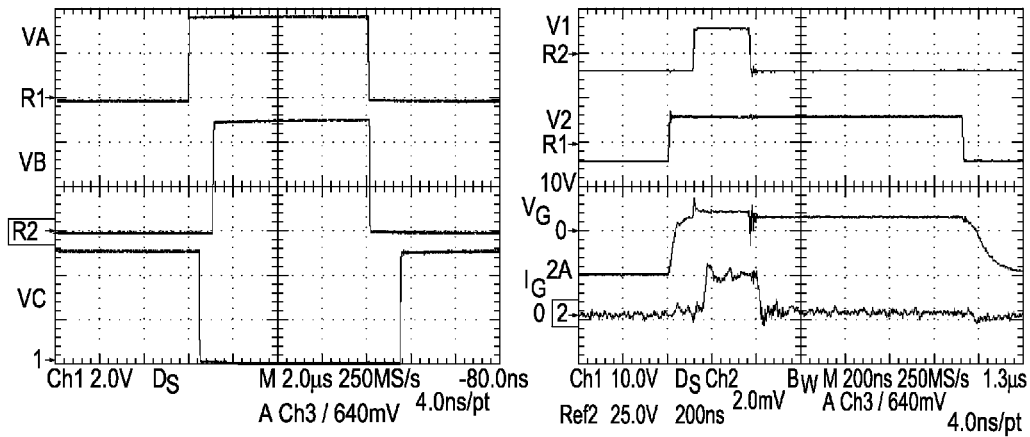
FIG. 16B shows the Dead Time of the input of a logic gate and the output of the logic gate.
FIG. 16C shows an upper turn-on driver causing an extra time delay comparing to the output of a lower turn-on driver.

FIG. 16B shows the Dead Time of the input VA of the logic gate U12 and the output VB of the logic gate U12. The waveforms of the output of the upper turn-on driver U9 is shown in FIG. 16C as V1, and the waveforms of the output of the lower turn-on driver U11 is shown in FIG. 16C as V2.

Figures 16D, 16E:
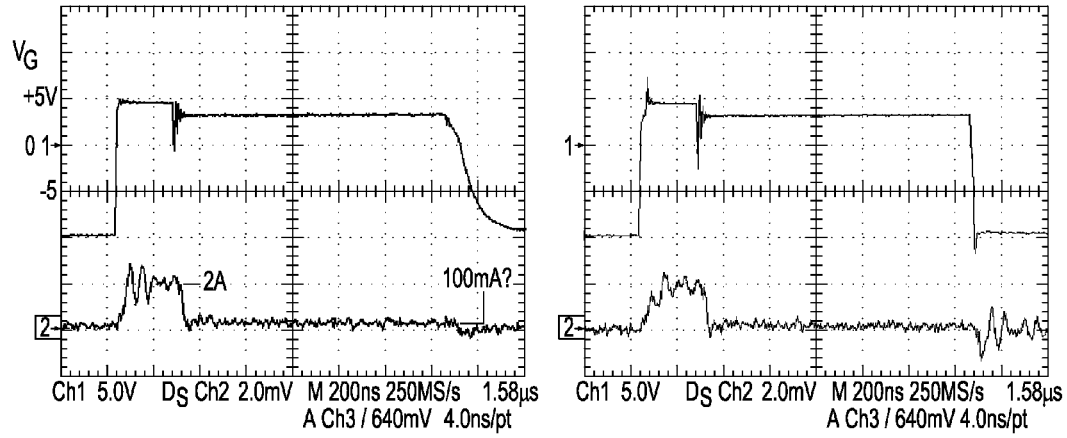
FIG. 16D shows the output of a upper turn-on driver and the output of a lower turn-on driver going high simultaneously.
FIG. 16E shows the effect of adding a speed up circuit.

FIG. 16C shows the upper turn-on driver U9 causes an extra time delay comparing to the output of the lower turn-on driver U11. This delay is too far behind a "maintain ON" pulse from the lower turn-on driver U11. One effective approach which can be employed to reduce the time delay comprises adding a 1.5 K resistor and a 120 pF capacitor RC delay circuit at the input to the lower turn-on driver U11 to align the V1 and V2 as shown in FIG. 16D. The value of the resistor and capacitor of the RC delay circuit can be chosen such that the output of the upper turn-on driver U9 and the output of the lower turn-on driver U11 will go high simultaneously.

In FIG. 16D, the output of the upper turn-on driver U9 and the output of the lower turn-on driver U11 are shown going high simultaneously. When the third resistor (6.8 ohm shown) and the second diode D2 were not used as depicted in FIG. 16D a slow turn-off is observed. In order to speed up the turn-off, the third resistor (6.8 ohm shown) and the second diode D2 were used to create a faster turn-off. The effect of adding the speed up circuit is shown in FIG. 16E.

Exemplary Embodiments

A circuit is provided which comprises:
- a wide bandgap junction field effect transistor (JFET); and
- a DC-coupled, two-stage driver, wherein the driver comprises:
    - a logic circuit for receiving a pulse-width modulation (PWM) control signal and generating an enabling signal and an inverse PWM signal;
    - an IC driver (509) circuit having the PWM input signal and the enabling signal input from the logic circuit LOGIC; and
    - a transistor driver circuit having an input of the inverse PWM signal;
    - wherein the IC driver (509) circuit and the transistor driver circuit are configured to accept the input pulse-width modulation (PWM) control signal and generate an output driver signal VG for driving the gate of the wide bandgap JFET.

The logic circuit LOGIC comprises: a first NOR gate, a second NOR gate, a first capacitor having a first terminal and a second terminal, a second diode 1N914 having an anode and a cathode, a fourth resistor 500 having a first terminal and a second terminal, a third NOR gate, and a fourth NOR gate. Each of the first, second, third and fourth NOR gate has a first input, a second input and an output. The detailed circuit layout is depicted in the FIG. 17A.

The IC driver (509) circuit comprises a 509 Driver IC, and a first resistor 1. The 509 Driver IC has a positive power supply, a negative power supply, an input terminal receiving the PWM control signal, an input for receiving enabling signal, and an output. The input for receiving enabling signal receives the enabling signal from the output of the logic circuit LOGIC. The input terminal receives the PWM control signal. The output of the 509 Driver IC coupled to the first terminal of the first resistor, the second terminal of the first resistor coupled to the gate terminal of the JFET.

The transistor driver circuit comprises a zener diode D1 having an anode and a cathode, a second resistor 100 having a first terminal and a second terminal, a transistor 2N3906 having a base terminal, an emitter terminal and a collector terminal, and a third resistor 15 having a first terminal and a second terminal. The anode of the zener diode D1 forms the input of the transistor driver circuit. The cathode of the zener diode D1 is connected to the first terminal of the second resistor 100. The second terminal of the second resistor 100 is connected to the base terminal of the transistor. The emitter terminal of the transistor is connected to the positive power supply of the transistor driver circuit. The collector terminal of the transistor is connected to the first terminal of the third resistor. The second terminal of the third resistor is connected to the output of the IC driver (509) circuit and the gate terminal of the JFET.

The output of the IC driver (509) circuit and the output of the transistor driver circuit are connected together to form the input to the wide bandgap junction field effect transistor (JFET).

EXPERIMENTAL

Figure 17A:
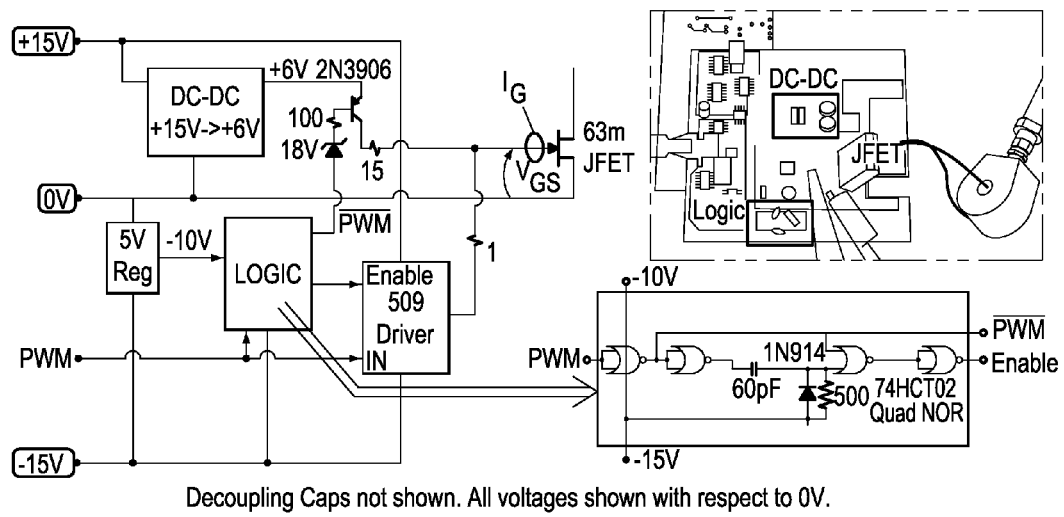
FIG. 17A depicts an approach in which dual driver circuits were used to drive an enhancement-mode (EM) SiC JFET.
Figure 17B:
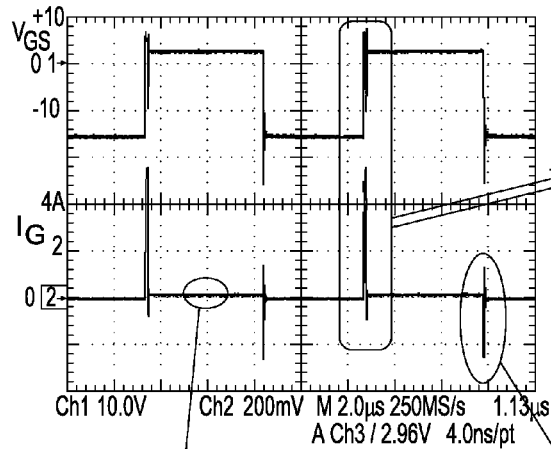
FIG. 17B shows double pulse waveforms of the voltage between the gate terminal and the source terminal of the JFET, and the current flowing into the gate of the JFET.
Figure 17C:
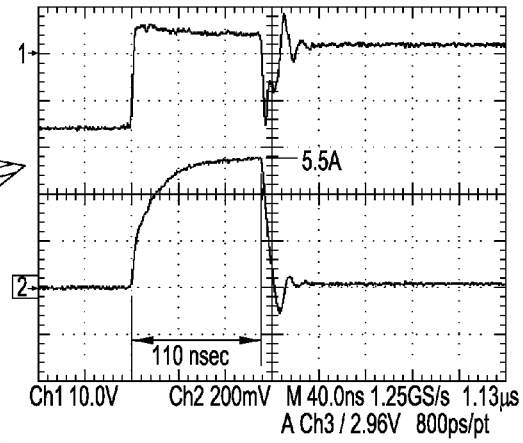
FIG. 17C shows the turn-on voltage between the gate and source terminals of the JFET, and the turn-on pulse current flow into the gate of the JFET.
Figure 17D:
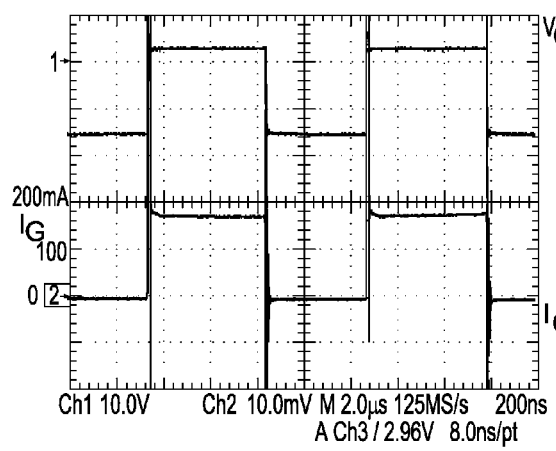
FIG. 17D shows the double pulse current flow into the gate of the JFET.
Figure 17E:
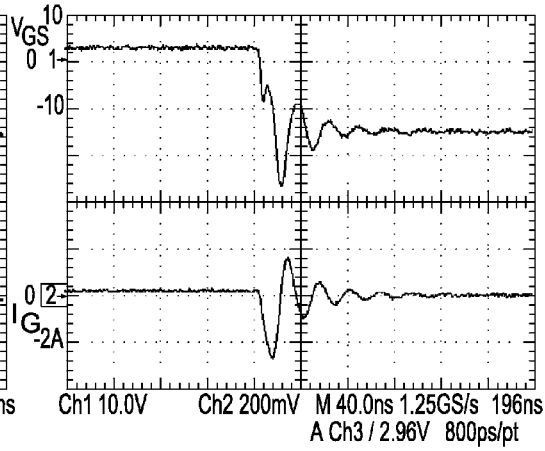
FIG. 17E shows the turn-on voltage between the gate and source terminals of the JFET, and the turn-on pulse current flow into the gate of the JFET.

A dual driver circuits was used to drive an enhancement-mode (EM) SiC JFET. This approach is depicted in FIG. 17A. In this circuit, the output of the logic circuit LOGIC is connected to the enabling signal input of the IC driver circuit and the inverse of PWM signal output of the logic circuit LOGIC is connected to the input of the transistor driver circuit. FIG. 17B shows double pulse waveforms of the voltage between the gate terminal and the source terminal of the JFET, and the current flowing into the gate of the JFET. The FIG. 17C shows the turn-on voltage between the gate and source terminals of the JFET, and the turn-on pulse current flow into the gate of the JFET, showing the current peaked at 5.5 A. Therefore, at least one high current driver, such as the IC driver, is needed for both turn-on and turn-off. When it is shown in an enlarged time scale, a ripple effect is shown at the turn-on and turn-off edges. The FIG. 17D shows the double pulse current flow into the gate of the JFET. It shows the turn-on and turn-off edges are swift and clean. The "stay-on" current can be provided by a lower current transistor powered from a lower power supply. Such an arrangement is used to economize on components and reduce the losses in the associated gate resistor. The FIG. 17E shows the turn-on voltage between the gate and source terminals of the JFET, and the turn-on pulse current flow into the gate of the JFET. When it is shown in an enlarged time scale, a ripple effect is shown at the turn-on and turn-off edges.

Figure 18A:
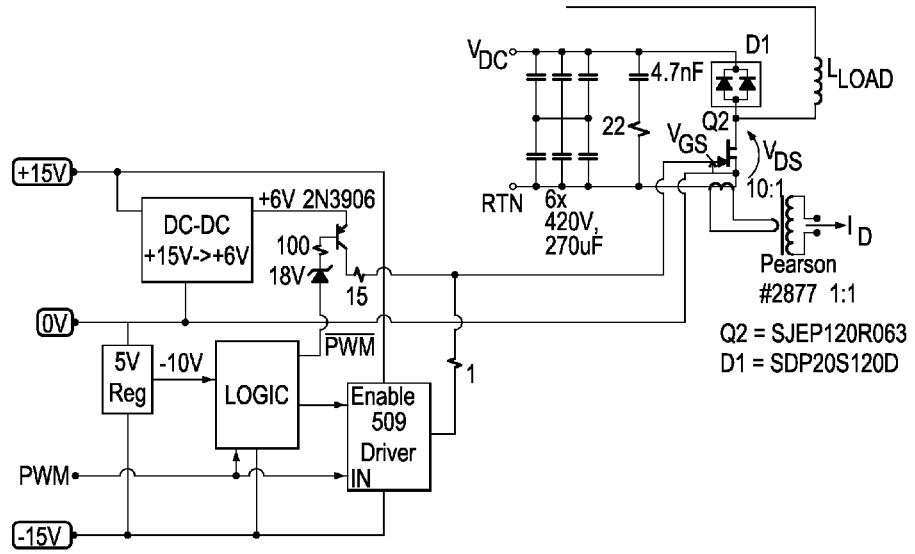
FIG. 18A shows another two stage driver circuit.
Figures 18B, 18C:
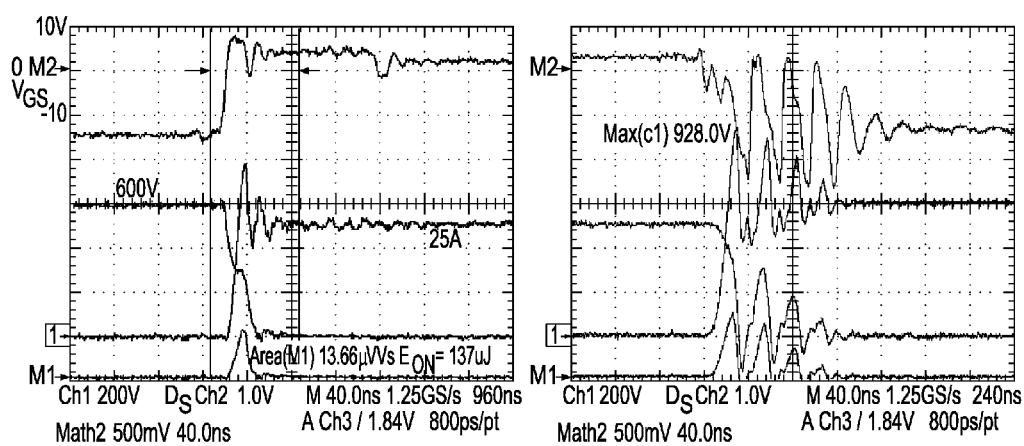
FIG. 18B shows the turn-on voltage between the gate and source terminal of a JFET, and the turn-off current flowing into the gate terminal of the JFET.
FIG. 18C shows the turn-off voltage between the gate and source terminal of a JFET, and the turn-off current flowing into the gate terminal of the JFET.

Another similar two stage driver circuit is shown in FIG. 18A. Only the components around the JFET were further added and modified. The FIG. 18B shows the turn-on voltage between the gate and source terminal of the JFET, and the turn-off current flowing into the gate terminal of the JFET. The turn-on waveforms shown are reasonably good. The FIG. 18C shows the turn-off voltage between the gate and source terminal of the JFET, and the turn-off current flowing into the gate terminal of the JFET. The turn-off waveforms shown have too much ripple. The reason for such ripple is probably associated with high dV/dT false triggering the logic circuit, due to "sky-wiring".

The foregoing description of the exemplary embodiments of the invention has been presented only for the purposes of illustration and description and is not intended to be exhaustive or to limit the invention to the precise forms disclosed. Many modifications and variations are possible in light of the above teachings.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

REFERENCES

[1] D. Bortis, P. Steiner, J. Biela, and J. W. Kolar, "Double-Stage Gate Driver Circuit for Parallel Connected IGBT Modules," Proc. of the 2008 IEEE International Power Modulator Conference (2008).
[2] G. Schmitt, R. Kennel, and J. Holtz, "Voltage Gradient Limitation of IGBTs by Optimized Gate-Current Profiles," Power Electronics Specialists Conference, 2008. PESC 2008, pp. 3592-3596 (Jun. 15-19, 2008).
[3] M. Abu-Khaizaran, P. Palmer, and Y. Wang, "Parameters Influencing the Performance of an IGBT Gate Driver," Power Electronics Specialists Conference, 2008, pp. 3457-3462 (Jun. 15-19, 2008).

What is claimed is:

1. A two-stage gate driver circuit for driving a junction field effect transistor having a gate, a source, and a drain, the two-stage gate driver circuit comprising:
    an input for receiving an input control pulse signal with which switching of the junction field effect transistor is to be synchronized;
    a first on circuit that provides, in response to the input control pulse signal, a forward gate current to the junction field effect transistor at least during a conduction stage of the junction field effect transistor;
    a second turn-on circuit that provides, in response to the input control pulse signal, a current to charge the gate during at least part of a turn-on stage of the junction field effect transistor, wherein the current to charge the gate is relatively higher than the forward gate current; and
    a pull-down circuit,
    wherein the first on circuit, the second turn-on circuit and the pull-down circuit are electrically coupled between the input and the gate of the junction field effect transistor in parallel, and
    wherein the current to charge the gate during at least part of a turn-on stage of the junction field effect transistor is a pulse that terminates while the forward gate current is provided by the first on circuit.

2. The two-stage gate driver circuit of claim 1, wherein the first on circuit comprises:
    a first switch having a gate, a source electrically coupled to the gate of the junction field effect transistor through a first resistor and a drain electrically coupled to a first current source for providing a first positive voltage; and
    a pulse generator electrically coupled between the input and the gate of the first switch.

3. The two-stage gate driver circuit of claim 2, wherein the pulse generator is configured such that the pulse generator responds to supply of the input control pulse signal by generating a corresponding control pulse signal that is in synchronization with the input control pulse signal.

4. The two-stage gate driver circuit of claim 3, wherein the generated control pulse signal has a first pulse duration that is equal to or less than 15% of the pulse on duration of the input control pulse signal.

5. The two-stage gate driver circuit of claim 3, wherein the generated control pulse signal has a first pulse duration that is adjustable manually.

6. A two-stage gate driver circuit for driving a junction field effect transistor having a gate, a source, and a drain, the two-stage gate driver circuit comprising:
    an input for receiving an input control pulse signal with which switching of the junction field effect transistor is to be synchronized;
    a first on circuit that provides, in response to the input control pulse signal, a forward gate current to the junction field effect transistor at least during a conduction stage of the junction field effect transistor, wherein the first on circuit comprises
    a first switch having a gate, a source electrically coupled to the gate of the junction field effect transistor through a first resistor and a drain electrically coupled to a first current source for providing a first positive voltage, and
    a pulse generator electrically coupled between the input and the gate of the first switch, wherein the pulse generator is configured such that the pulse generator responds to supply of the input control pulse signal by generating a corresponding control pulse signal that is in synchronization with the input control pulse signal, wherein the generated control pulse signal has a first pulse duration of the generated control pulse signal that is adjustable automatically in accordance with a feedback signal from the junction field effect transistor;
    a second turn-on circuit that provides, in response to the input control pulse signal, a current to charge the gate during at least part of a turn-on stage of the junction field effect transistor, wherein the current to charge the gate is relatively higher than the forward gate current; and
    a pull-down circuit,
    wherein the first on circuit, the second turn-on circuit and the pull-down circuit are electrically coupled between the input and the gate of the junction field effect transistor in parallel.

7. The two-stage gate driver circuit of claim 1, wherein the second turn-on circuit comprises
- a second switch having a gate electrically coupled to the input,
- a source electrically coupled to the gate of the junction field effect transistor through a second resistor, and
- a drain electrically coupled to a second current source for providing a second positive voltage.

8. The two-stage gate driver circuit of claim 7, wherein the pull-down circuit comprises:
- a third switch having a gate;
- a source electrically coupled to a third current source for providing a negative voltage;
- a drain electrically coupled to the gate of the junction field effect transistor through a third resistor; and
- an inverter electrically coupled between the input and the gate of the third switch.

9. The two-stage gate driver circuit of claim 1, wherein the first on circuit is electrically coupled between a first current source and the gate of the junction field effect transistor through a first resistor, wherein the first current source is adapted for providing a first positive voltage.

10. The two-stage gate driver circuit of claim 9, wherein:
- the first on circuit is turned on for a first duration that is equal to or less than 15% of the pulse on duration of the control pulse signal in response to the input control pulse signal; and
- the first on circuit is turned off for the pulse-off duration in response to the input control pulse signal.

11. The two-stage gate driver circuit of claim 10, wherein the second on circuit is electrically coupled between a second current source and the gate of the junction field effect transistor through a second resistor, wherein resistance of the first resistor>resistance of the second resistor, and wherein the second current source is adapted for providing a second positive voltage.

12. The two-stage gate driver circuit of claim 11, wherein the first and second current sources correspond to a single current source or to two different current sources.

13. The two-stage gate driver circuit of claim 11, wherein the pull-down circuit is electrically coupled between a third current source and the gate of the junction field effect transistor through a third resistor, wherein the third current source is adapted for providing a negative voltage.

14. The two-stage gate driver circuit of claim 1, wherein the junction field effect transistor is a wide bandgap junction field effect transistor or a SiC junction field effect transistor.

15. The two-stage gate driver circuit of claim 1, wherein the forward gate current and the current to charge the gate begin essentially simultaneously.

16. The two-stage gate driver circuit of claim 1, wherein the first on circuit and the second turn-on circuit are of a single integrated circuit.

17. The two-stage gate driver circuit of claim 1, wherein the current to charge the gate during at least part of a turn-on stage of the junction field effect transistor causes the gate voltage to overshoot.

18. The two-stage gate driver circuit of claim 1, wherein the pulse lasts at least until a turn-on time of the junction field effect transistor.

19. The two-stage gate driver circuit of claim 18, wherein the pulse exceeds the turn-on time by less than 100 ns.

20. The two-stage gate driver circuit of claim 12, wherein the first on circuit comprises a current-limiting resistor having a resistance sized to set the forward gate current while stepping down a voltage to a voltage required by the gate of the junction field effect transistor.

21. The two-stage gate driver circuit of claim 1, wherein the pull-down circuit uses a complement of the input control pulse signal in pulling the gate of the junction field effect transistor low.

* * * * *